(12) United States Patent
Ma

(10) Patent No.: US 6,230,396 B1
(45) Date of Patent: May 15, 2001

(54) TOOL FOR ASSEMBLING/DISASSEMBLING RETAINER TO/FROM CONNECTOR

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/387,638

(22) Filed: Aug. 31, 1999

(30) Foreign Application Priority Data

May 15, 1999 (TW) ................................................ 88107902

(51) Int. Cl.⁷ ...................................................... B23P 19/00
(52) U.S. Cl. .................................. 29/758; 29/764; 29/739
(58) Field of Search ............................. 29/758, 741, 764, 29/739

(56) References Cited

U.S. PATENT DOCUMENTS

| | | | |
|---|---|---|---|
| 3,896,535 | * | 7/1975 | Tucci ........................................ 29/758 |
| 4,141,138 | * | 2/1979 | Quick . | |
| 4,604,796 | * | 8/1986 | Tsipenyuk et al. ...................... 29/758 |
| 5,075,960 | * | 12/1991 | Smith ....................................... 29/758 |
| 5,230,143 | * | 7/1993 | Kartlovich . | |
| 5,265,328 | * | 11/1993 | Gorman . | |
| 5,440,803 | * | 8/1995 | Selgas, Jr. et al. . | |
| 5,479,669 | * | 1/1996 | Cheen ..................................... 29/758 |
| 5,926,948 | * | 7/1999 | Pong ....................................... 29/758 |
| 6,098,814 | * | 8/2000 | Ma . | |

* cited by examiner

*Primary Examiner*—Carl J. Arbes
(74) *Attorney, Agent, or Firm*—Wei Te Chung

(57) ABSTRACT

An assembly tool (1) for use with a retainer (2) comprises a handle section (11) having a curved surface for facilitating handling thereof, an operation section (12) having a cam shape, and an intermediate joint section (13) perpendicular to the operation section. In assembly, one end of the retainer is first mounted to an electrical connector (3). The operation section of the tool is then inserted into a pair of clamping walls (25) formed in the other end of the connector. The handle section of the tool is rotated to urge the operation section to simultaneously rotate thereby expanding the clamping walls of the connector. The retainer is thereby assembled to the connector from a top surface thereof. Similarly, disassembly of the retainer from the connector is also easily and quickly implemented by the assembly tool.

5 Claims, 10 Drawing Sheets

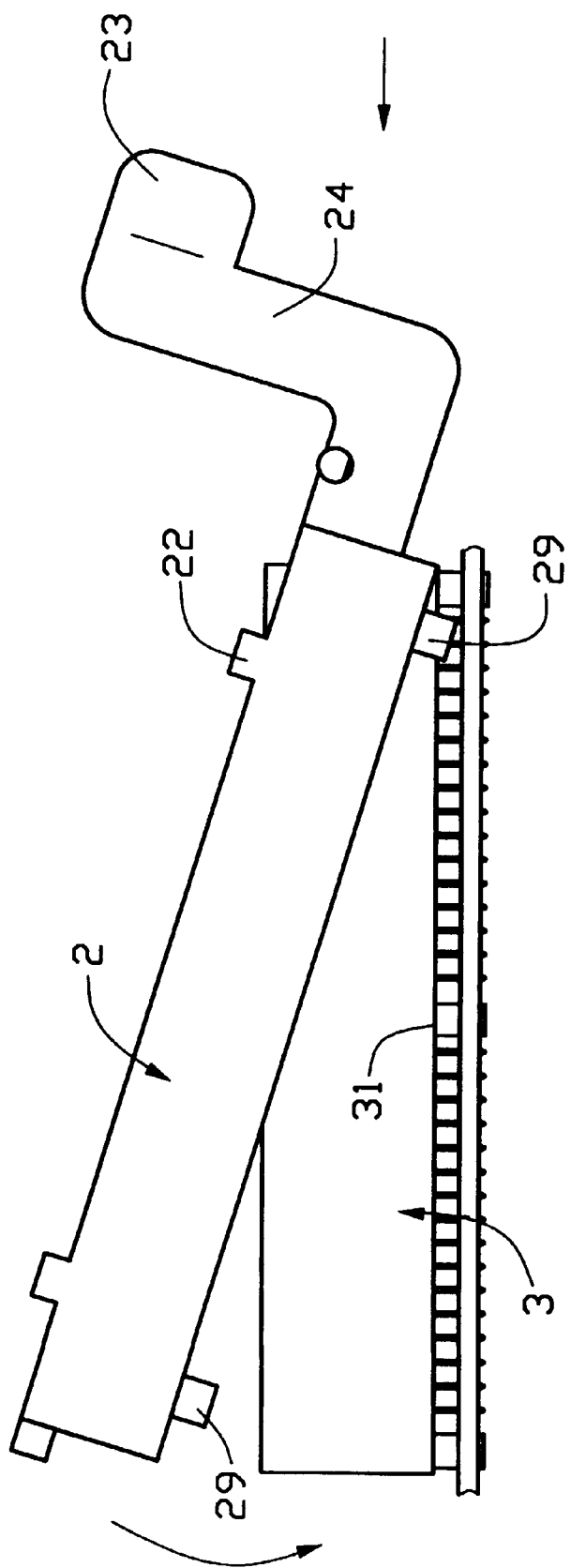

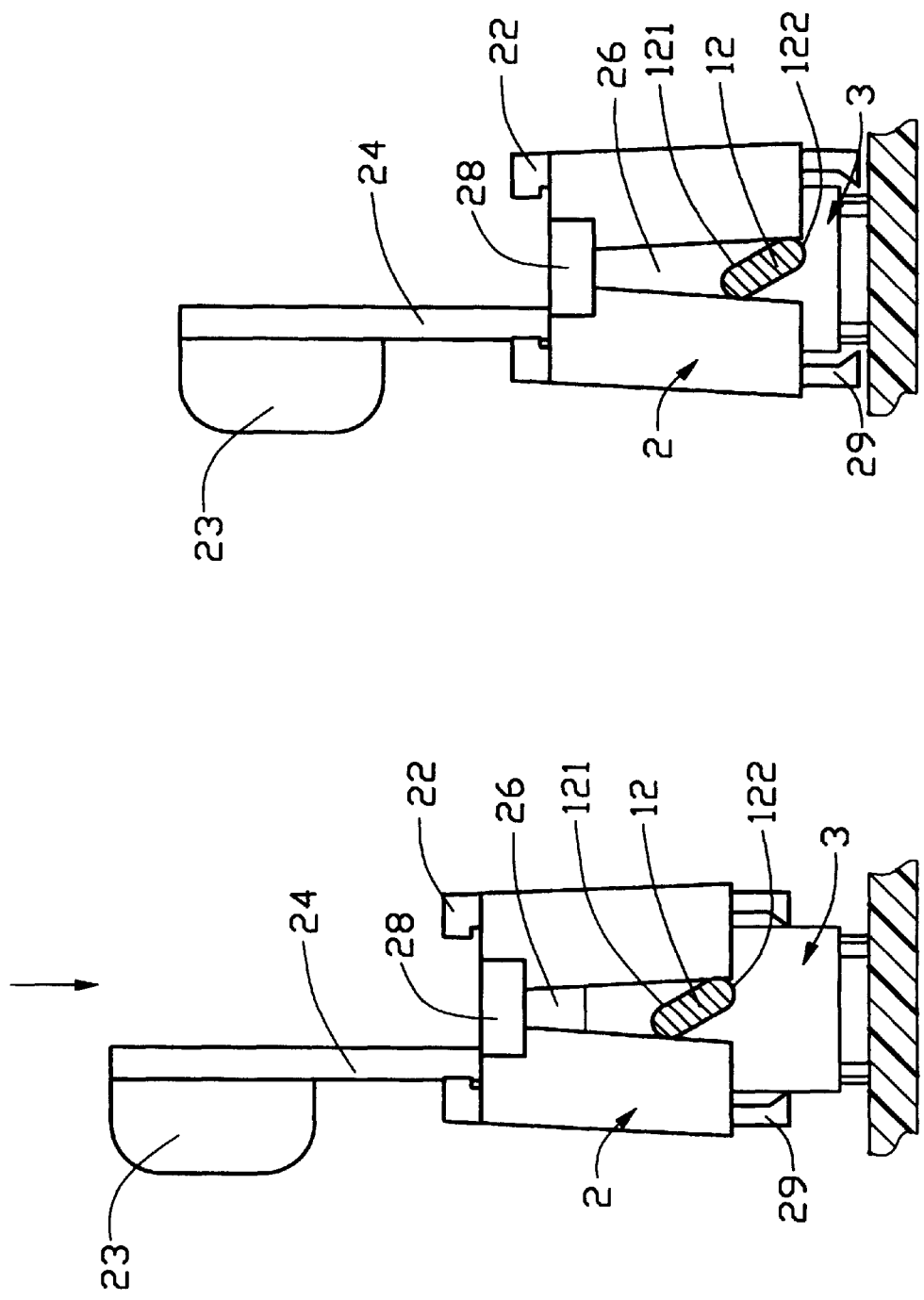

TOOL FOR ASSEMBLING/DISASSEMBLING RETAINER TO/FROM CONNECTOR

BACKGROUND OF THE INVENTION

1. Field of the Invention

The present invention relates to an assembly tool, and more particularly to an assembly tool for facilitating assembly and disassembly of a retainer to and from an electrical connector.

2. Description of Prior Art

A card edge connector is commonly used to interconnect an inserted circuit board to a mother board. To retain the inserted circuit board in position, a retainer is introduced which encloses the connector due to the resiliency thereof. Since manual assembly and disassembly are difficult due to the significant resilient force exerted by the retainer during assembly and disassembly, an auxiliary tool must be used.

A conventional assembly tool 1' for use with a retainer 2' assembled to a card edge connector 3' is shown in FIGS. 1A and 1B. The assembly tool 1' having an inverse V-shape is integrally stamped and formed from sheet metal. The assembly tool 1' comprises a pair of symmetrical guiding sides 11' with two pairs of L-shaped abutting tabs 12' extending downward from opposite edges thereof. A pair of guiding pieces 13' is formed proximate each pair of abutting tabs 12' corresponding to a pair of latching legs 21' extending downward from the retainer 2'.

In assembly, the assembly tool 1' is first mounted to the connector 3' from a top surface thereof with the abutting tabs 12' abutting against a bottom surface 31'. The retainer 2' is then guided along the guiding sides 11' and guiding pieces 13' of the assembly tool 1' to the connector 3'. The retainer 2' expands due to the V-shaped guiding sides 11' thereby facilitating assembly. After the retainer 2' is assembled to the connector 3', the assembly tool 1' is removed.

One problem with such a design is that although assembly of the retainer 2' to the connector 3' is facilitated, disassembly thereof can not be achieved. In addition, a significant external force is required during assembly.

SUMMARY OF THE INVENTION

Accordingly, one object of the present invention is to provide an assembly tool for facilitating both assembly and disassembly of a retainer to and from an electrical connector.

Another object of the present invention is to provide an assembly tool for a retainer which requires a small external force during assembly and disassembly.

In order to achieve the objects set forth, an assembly tool for use with a retainer comprises a handle section having a curved surface for facilitating handling thereof, a cam-shaped operation section having a pair of opposite planes and a pair of opposite convex surfaces, and an intermediate joint section perpendicular to the operation section.

When assembling the retainer to an electrical connector, one end of the retainer is first mounted to the connector. The operation section of the tool is inserted between a pair of clamping walls formed on the other end of the retainer. The handle section of the tool is then rotated to urge the operation section to simultaneously rotate thereby expanding the clamping walls of the connector. Thus, the retainer can be easily and quickly assembled to the connector from a top surface thereof and retentively enclose the connector after the tool is extracted therefrom.

In disassembly, the operation section is first inserted between the pair of clamping walls of the connector. The handle section of the tool is then rotated to urge the operation section to simultaneously rotate whereby the clamping walls of the connector expand. Thus, the retainer can also be easily and quickly removed from the connector from a bottom surface thereof and the tool is finally extracted therefrom.

Other objects, advantages and novel features of the invention will become more apparent from the following detailed description when taken in conjunction with the accompanying drawings.

BRIEF DESCRIPTION OF THE DRAWINGS

FIG. 4A is a front view of the connector and the retainer with one end thereof mounted to the connector;

FIGS. 4B through 4E are schematic side views sequentially illustrating the assembly process of the retainer to the connector;

DETAILED DESCRIPTION OF THE INVENTION

Figure 1A:
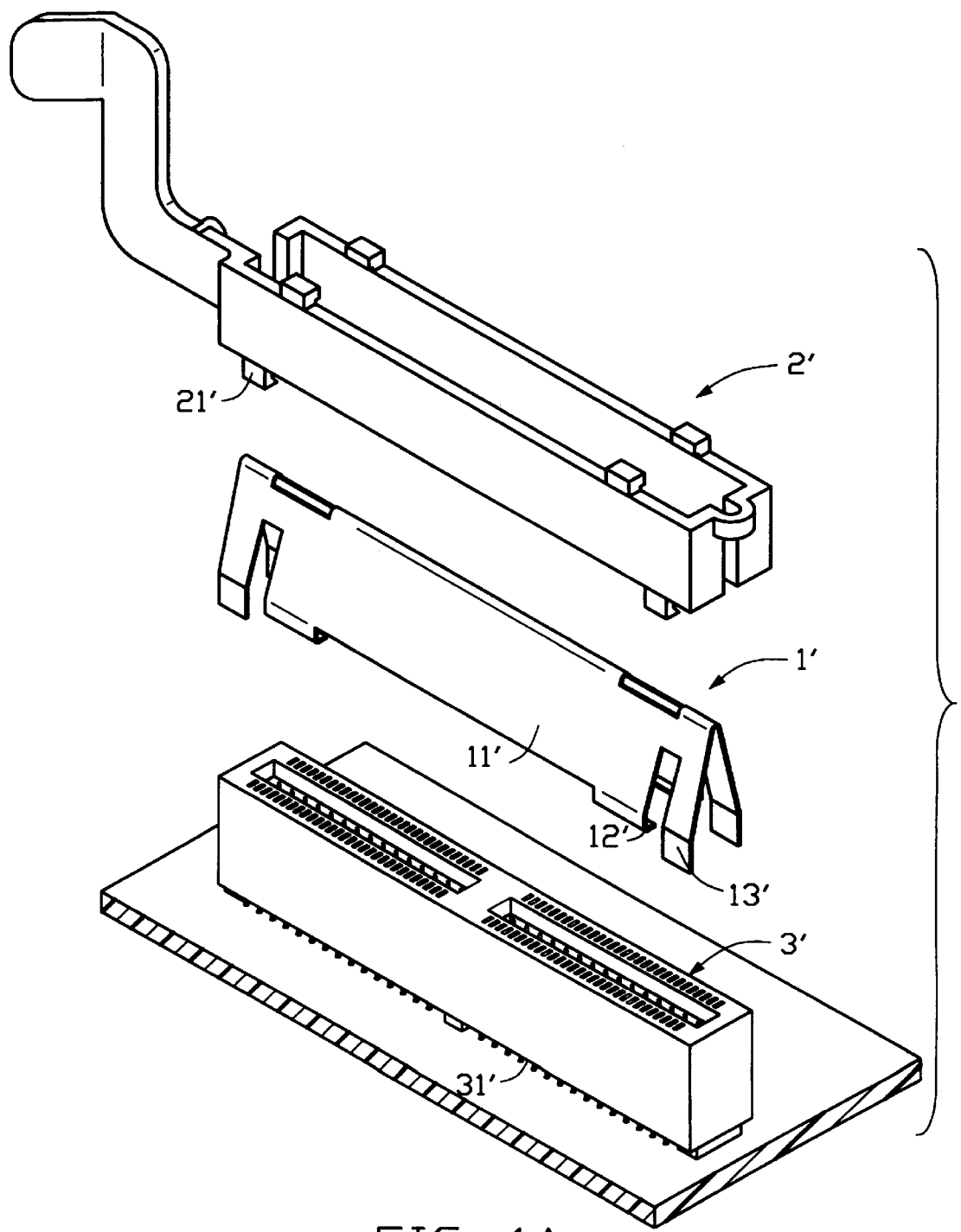
FIG. 1A is an exploded view of a conventional assembly tool, a retainer and a card edge connector mounted on a mother board.
Figure 1B:
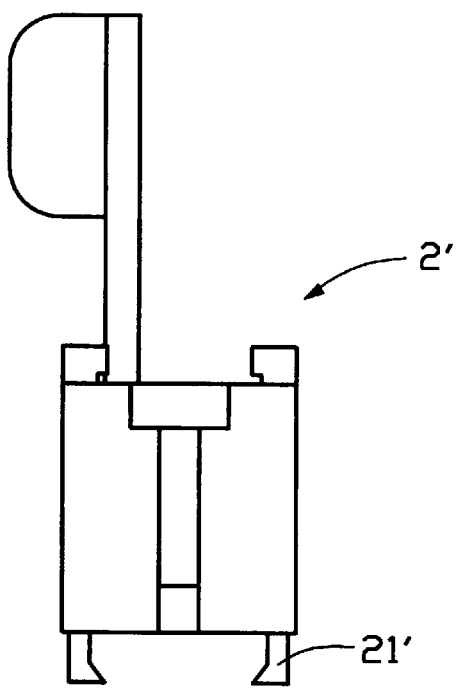
FIG. 1B is a side view of FIG. 1A.
Figure 1B:
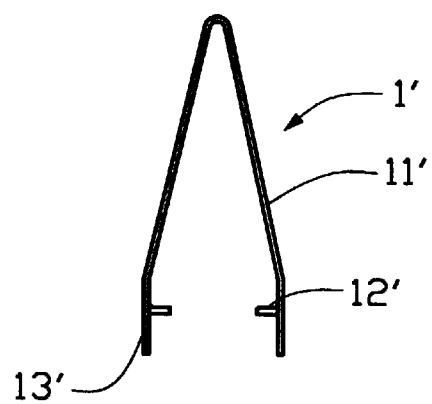
Figure 1B:
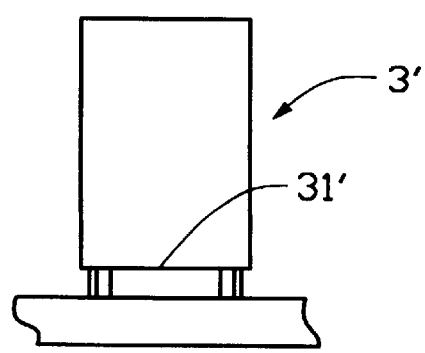
Figure 2:
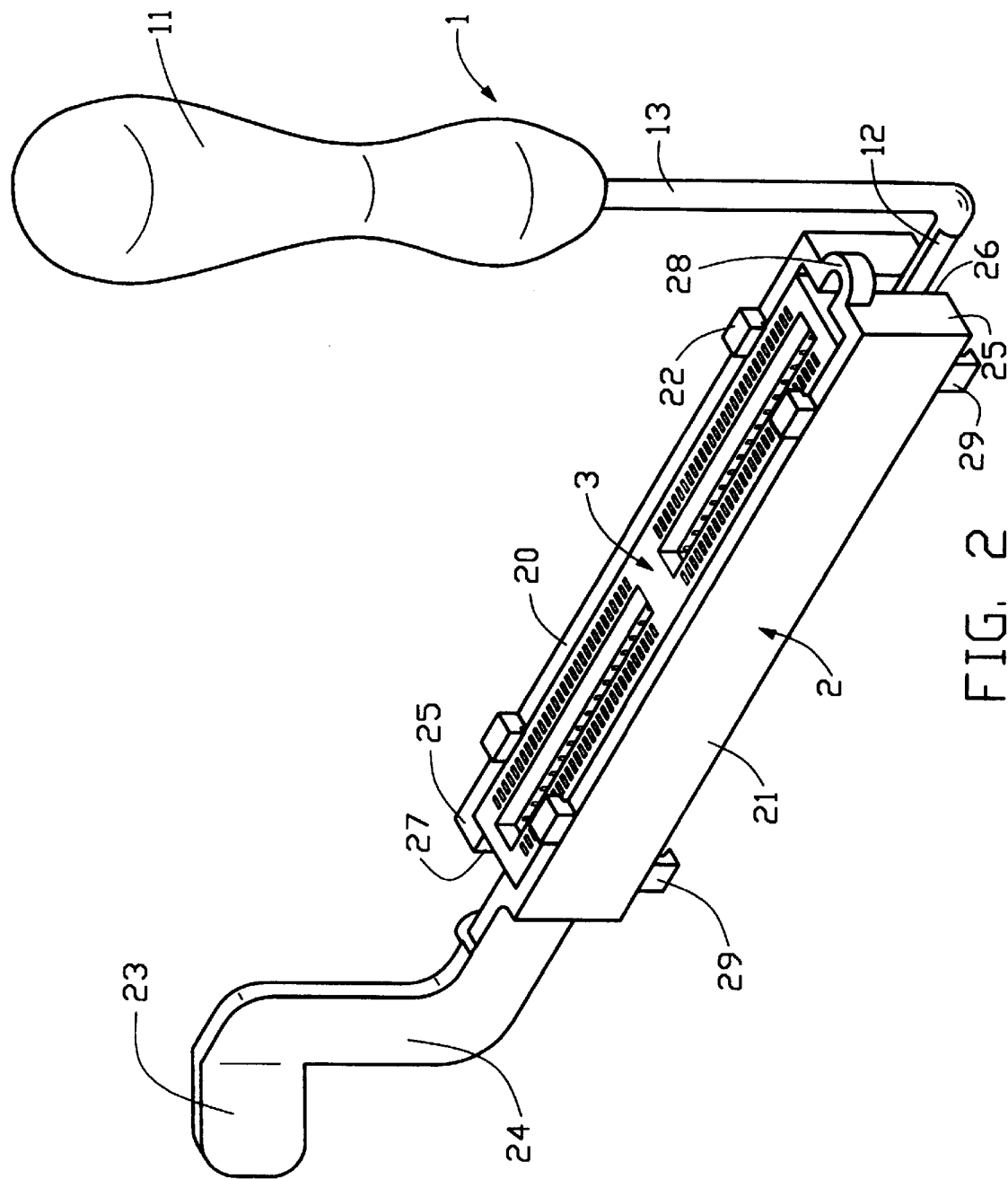
FIG. 2 is a perspective view of a retainer with a card edge connector retained therein and an assembly tool in operation in accordance with the present invention.
Figure 3:
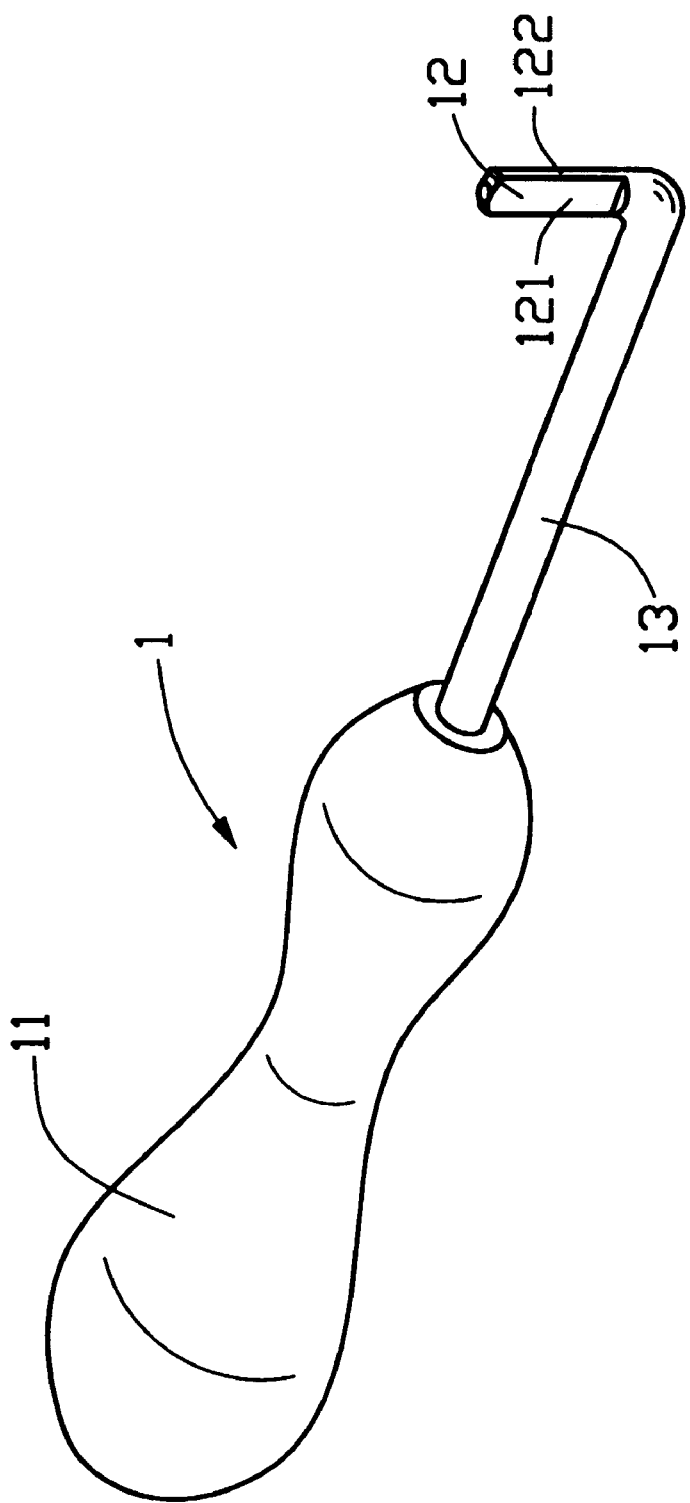
FIG. 3 is a perspective view of the assembly tool of FIG. 2.

Reference will now be in detail to a preferred embodiment of the present invention. Referring to FIGS. 2 and 3, an assembly tool 1 for use with a retainer 2 in accordance with a preferred embodiment of the present invention comprises a handle section 11, an operation section 12 and an intermediate joint section 13 perpendicular to the operation section 12. The handle section 11 has a configuration for facilitating handling thereof. In this embodiment, the handle section 11 has a curved shape in the form of two cones (not labeled) of different size. The operation section 12 having a cam shape is shaped by paring a cylindrical post to define a pair of opposite planes 121 and a pair of opposite convex surfaces 122. The distance between the planes 121 is smaller than the distance between the convex surfaces 122, the purpose of which will be apparent as described hereinafter.

The retainer 2 having an elongate shape is integrally ejection molded from plastic. The retainer 2 comprises a rectangular receiving frame 20 forming a pair of opposite side walls 21. A plurality of protrusions 22 is formed on top surfaces of the side walls 21 for preventing upward movement of a retained connector 3. Two pairs of latching legs 29 extend from bottom surfaces of the side walls 21 proximate opposite ends of the frame 20. Each latching leg 29 forms an inwardly bent tab dimensioned for abutting against a bottom surface 31 (FIG. 4A) of the connector 3 thereby preventing downward movement thereof. An L-shaped arm 24 with an angled portion 23 formed thereon longitudinally extends from one end of the frame 20 for retaining a circuit board (not shown) inserted into the connector 3 in position. A pair of channels 26, 27 is formed in opposite ends of the frame 20. Each channel 26, 27 is defined by a pair of opposite clamping walls 25, wherein the channel 26 distanced from the arm 24 is rectangular for insertion of the operation portion 12 of the assembly tool 1. An arcuate member 28 interconnects upper portions of the pair of clamping walls 25 proximate the channel 26.

Figure 4E:
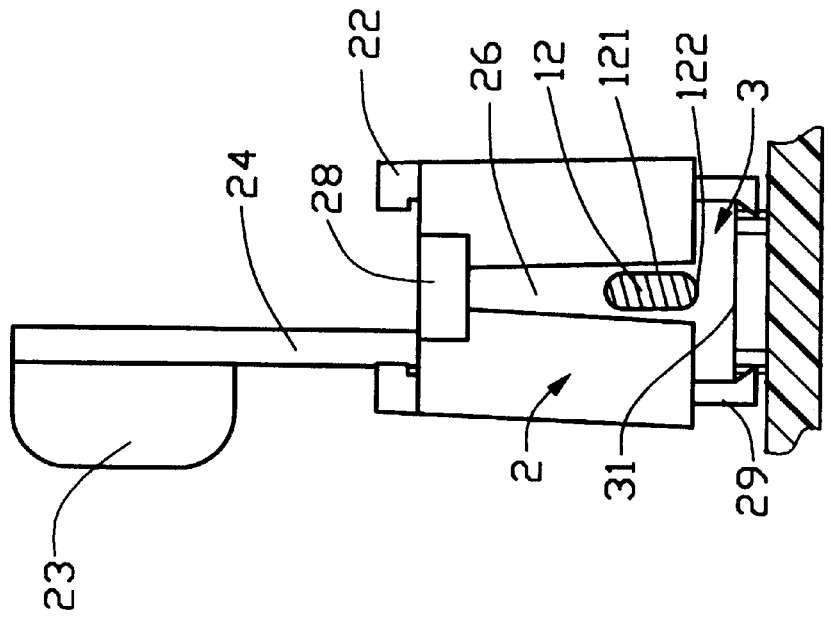
Figure 4D:
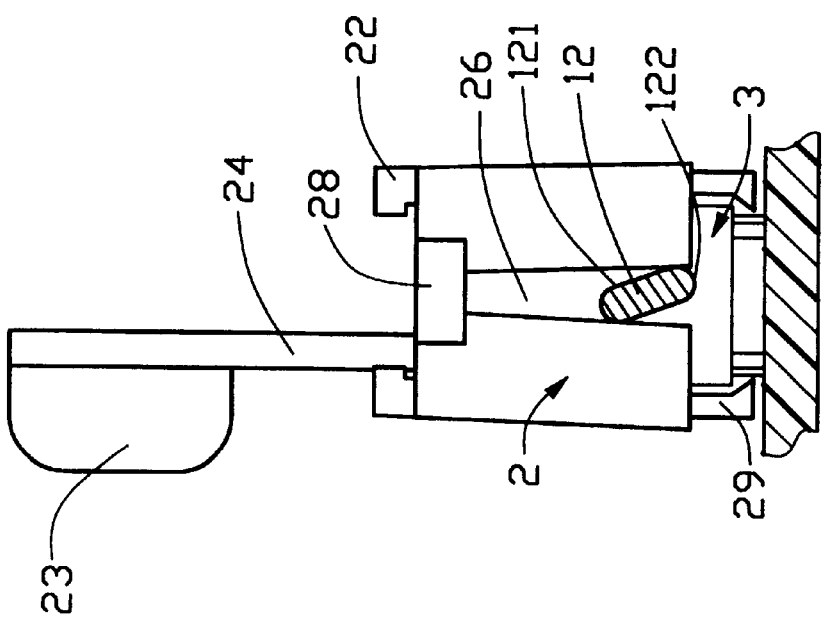

The process of assembling the retainer 2 to the connector 3 by the assembly tool 1 is shown in FIGS. 4A through 4E. In assembly, one end of the retainer 2 adjacent to the arm 24 is first locked to the connector 3 in a substantially oblique manner by abutting the latching legs 29 thereof against the bottom surface 31 of the connector 3, as shown in FIG. 4A. The operation section 12 of the assembly tool 1 is then inserted into the channel 26 of the retainer 2. The handle section 11 of the tool 1 is rotated to urge the operation section 12 to simultaneously rotate whereby the clamping walls 25 of the retainer 2 expand. When the distance of the pair of latching legs 29 proximate the channel 26 is expanded to a distance larger than the width of the connector 3, the retainer 2 is easily assembled to the connector 3 from a top surface thereof, as illustrated in FIGS. 4B through 4D. The tool 1 is removed from the channel 26 of the retainer 2 whereby the retainer 2 resumes its original shape. Thus, the retainer 2 retentively encloses the connector 3 with the protrusions 22 and the latching legs 29 thereof abutting against the top surface and the bottom surface 31 of the connector 3, respectively, as shown in FIG. 4E.

Figure 5A:
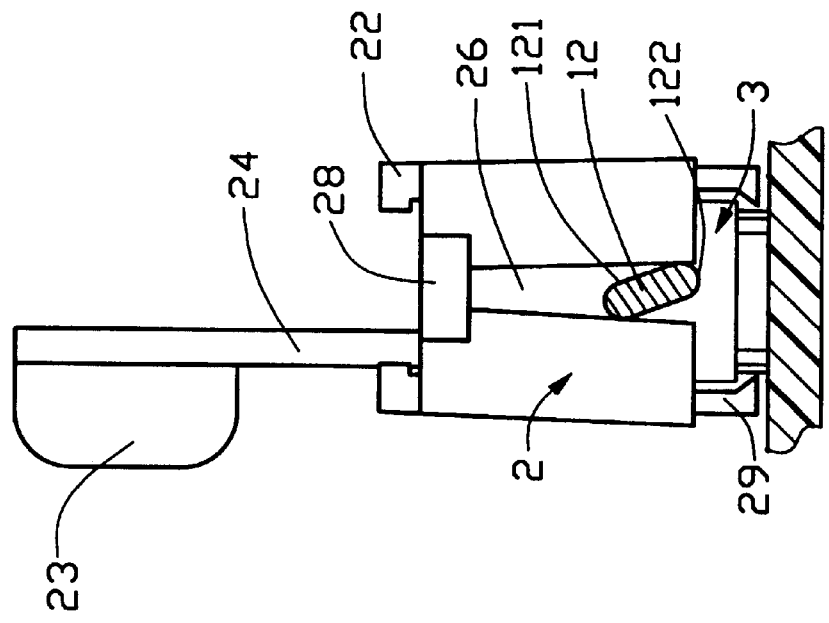
FIGS. 5A through 5D are schematic side views sequentially illustrating the disassembly process of the retainer from the connector.
Figure 5B:
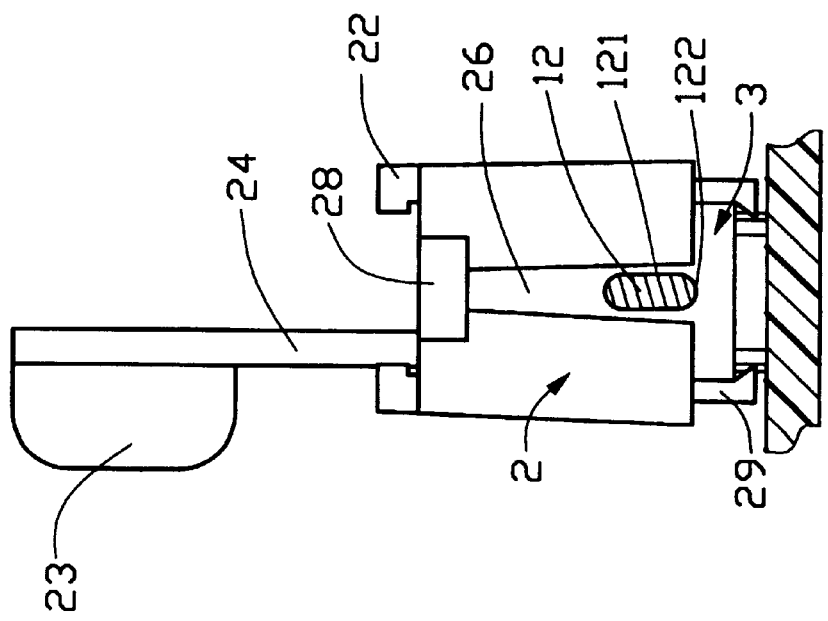
Figure 5D:
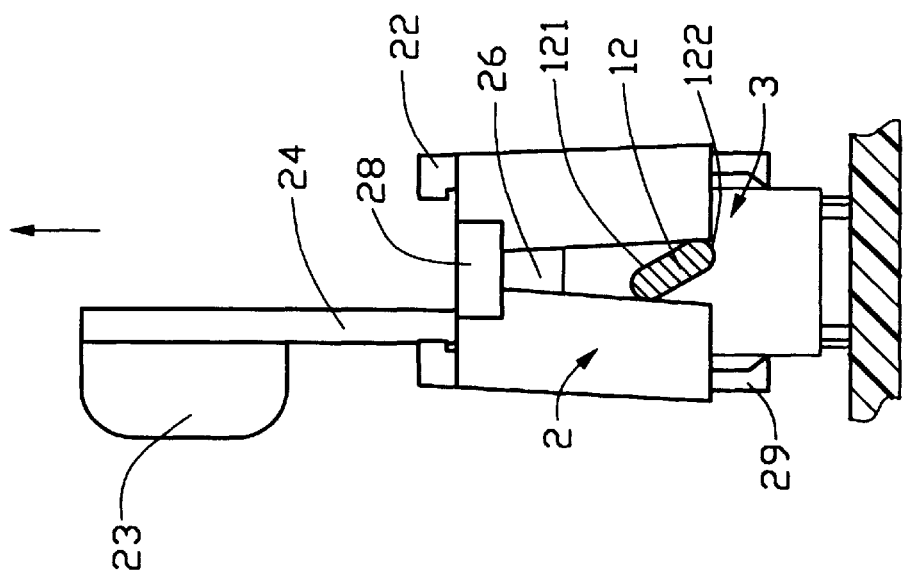
Figure 5C:
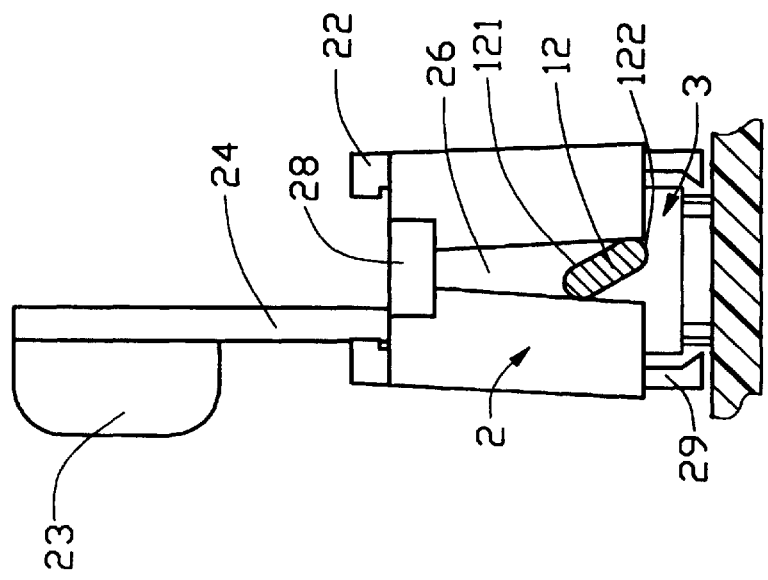
Figure 5E:
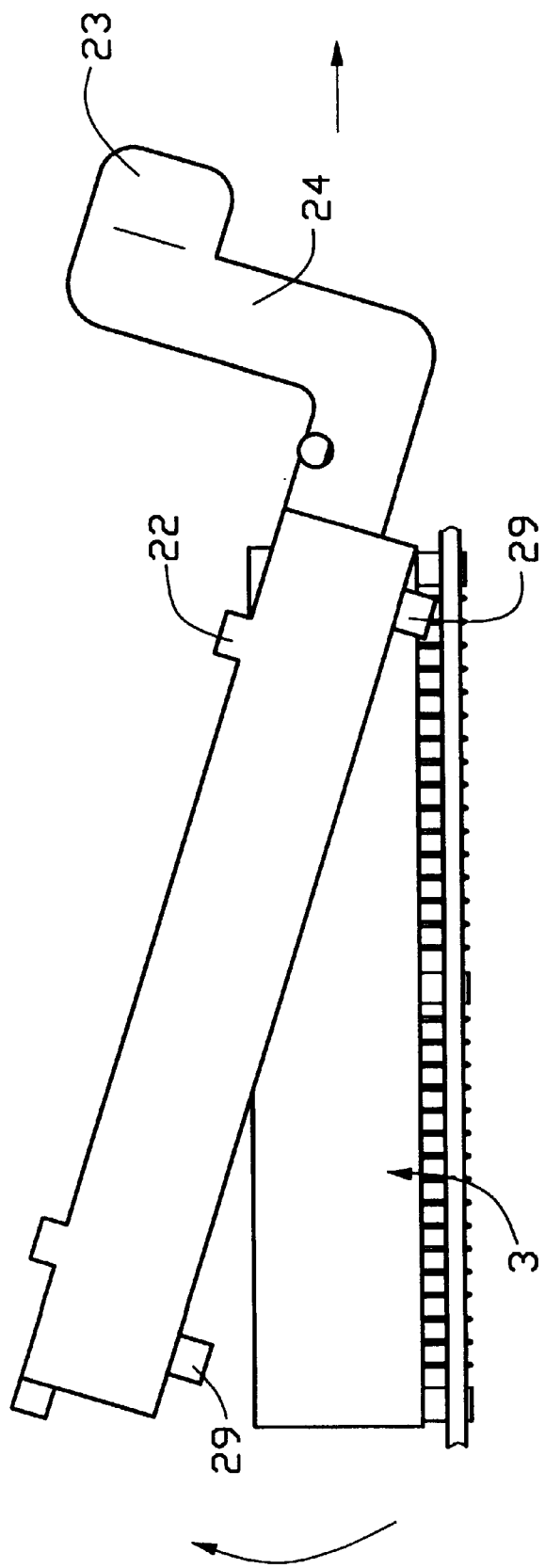
FIG. 5E is a front view of the retainer and the connector with one end of the retainer removed from the connector.

The process of disassembling the retainer 2 from the connector 3 by the assembly tool 1 is shown in FIGS. 5A through 5E. In disassembly, the operation section 12 of the assembly tool 1 is first inserted into the channel 26 of the retainer 2, as shown in FIG. 5A. The handle section 11 of the tool 1 is then rotated to urge the operation section 12 to simultaneously rotate whereby the clamping walls 25 of the retainer 2 adjacent the channel 26 expands. When the distance of the pair of latching legs 29 proximate the channel 26 is expanded to a distance larger than the width of the connector 3, the retainer 2 is easily removed from the connector 3 from the bottom surface 31, as illustrated in FIGS. 5B through 5D. The tool 1 is extracted from the channel 26 of the retainer 2 and the other pair of latching legs 29 are also removed from the connector 3.

Thus, the assembly and disassembly of the retainer 2 to and from the connector 3 are both facilitated by the provision of the assembly tool 1. In addition, during assembly and disassembly, only a small external force is required.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An assembly tool for assembling and disassembling a resilient retainer to and from an electrical connector, comprising:

a main portion comprising a handle section for facilitating handling thereof and a joint section; and an operation portion being substantially perpendicular to the joint section of the main portion, the operation portion having a first and a second pair of opposite side surfaces, the first pair of side surfaces being spaced a distance greater than a distance spaced between the second pair of side surfaces and being adapted for insertion into a corresponding groove defined in an end of the retainer, the distance between the first pair of side surfaces being measured in a direction parallel to the extending direction of the main portion, the operation portion being rotatable with the handle section of the main portion to enlarge the groove of the retainer, wherein the first pair of side surfaces of the operation portion comprises a pair of opposite convex surfaces formed by paring a cylindrical post, and wherein the second pair of side surfaces comprises a pair of opposite planar surfaces, the distance between the planar surfaces being smaller than the distance between the convex surfaces.

2. The assembly tool as described in claim 1, wherein the handle section is in the shape of two oblong lobes arranged along a longitudinal axis of the handle section.

3. The assembly tool as described in claim 1, wherein the operation portion and the joint sections are made from plastic material.

4. The assembly tool as described in claim 1, wherein the operation portion and the joint sections are made from metal.

5. A combination comprising a connector, a retainer mounted to the connector for retaining a circuit board in the connector, and an assembling tool for assembling or disassembling the retainer to or from the connector, said connector being of a card edge type defining an elogated housing, said retainer including a pair of opposite clamping walls with a channel therebetween and said clamping walls being bridged by an arcuate member around an upper portion of said channel, a plurality of latching legs being formed on a bottom portion of the clamping walls and being engaged with a bottom surface of the connector, said assembling tool including a handle section and an operation section wherein said channel is dimensioned to easily receive the operation section therein when said assembling tool is not operated and is actuated to expand when said assembling tool is operated to have the operation section provide a larger horizontal dimension in comparison with that in an inoperative position.

* * * * *